United States Patent
Belanger, Jr. et al.

[11] Patent Number: 5,885,091
[45] Date of Patent: Mar. 23, 1999

[54] METHOD AND APPARATUS FOR PROVIDING PLANAR AND NON-PLANAR COMPLIANT ELECTRICAL CONNECTIONS BETWEEN ADJACENT CIRCUITS

[75] Inventors: Thomas Dudley Belanger, Jr., Saline; John Trublowski, Troy; Joseph Valentine Bejster, Dearborn; Douglas Hughson, Jr., Farmington Hills, all of Mich.

[73] Assignee: Ford Motor Company, Dearborn, Mich.

[21] Appl. No.: 850,463

[22] Filed: May 5, 1997

[51] Int. Cl.⁶ .................................................. H01R 9/09
[52] U.S. Cl. ............................................................ 439/67
[58] Field of Search ............................... 439/67, 493, 77, 439/592, 597

[56] References Cited

U.S. PATENT DOCUMENTS

| | | | |
|---|---|---|---|
| 3,339,130 | 8/1967 | Schaeffer | 361/301.5 |
| 4,050,756 | 9/1977 | Moore | 439/91 |
| 4,116,516 | 9/1978 | Griffin | 439/67 |
| 4,116,517 | 9/1978 | Selvin et al. | 439/67 |
| 4,647,125 | 3/1987 | Landi et al. | 439/67 |
| 5,127,838 | 7/1992 | Zaderej et al. | 437/74 |
| 5,156,552 | 10/1992 | Zaderej et al. | 439/59 |
| 5,158,465 | 10/1992 | Zaderej et al. | 439/55 |
| 5,205,751 | 4/1993 | Schwzrtz et al. | 439/86 |
| 5,273,450 | 12/1993 | Renn et al. | 439/260 |
| 5,306,162 | 4/1994 | Armendariz | 439/67 |
| 5,313,368 | 5/1994 | Volz et al. | 361/774 |
| 5,316,486 | 5/1994 | Tanaka et al. | 439/67 |
| 5,345,364 | 9/1994 | Biernath | 361/749 |
| 5,419,712 | 5/1995 | Bellomo et al. | 439/327 |
| 5,468,995 | 11/1995 | Higgins, III | 257/697 |
| 5,519,201 | 5/1996 | Templeton, Jr. et al. | 235/492 |
| 5,528,466 | 6/1996 | Lim et al. | 361/820 |
| 5,540,594 | 7/1996 | Collins et al. | 439/66 |

*Primary Examiner*—Neil Abrams
*Assistant Examiner*—T. C. Patel
*Attorney, Agent, or Firm*—Joseph W. Malleck; Roger L. May

[57] ABSTRACT

A method and apparatus is provided for electrically interconnecting a circuit pattern with an adjacent circuit on a substrate. The circuit pattern is positioned in direct physical contact with the adjacent circuit to create a single electrical interface between the circuit pattern and the adjacent circuit. A compliant spring member is supported by the substrate for creating a normal force at the single electrical interface for holding the circuit pattern and adjacent circuit together. The compliant spring member is sufficiently flexible to facilitate electrical interconnection of the circuits along a non-planar substrate. Various embodiments are described.

4 Claims, 4 Drawing Sheets

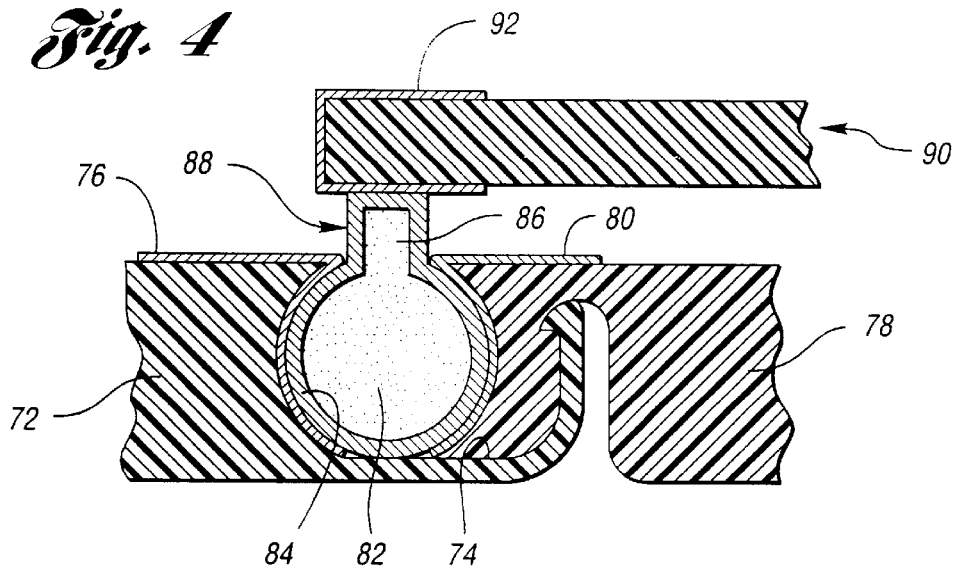
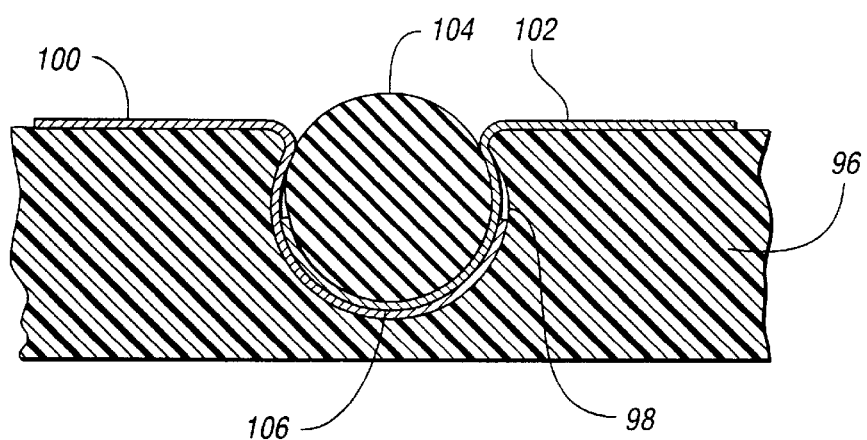
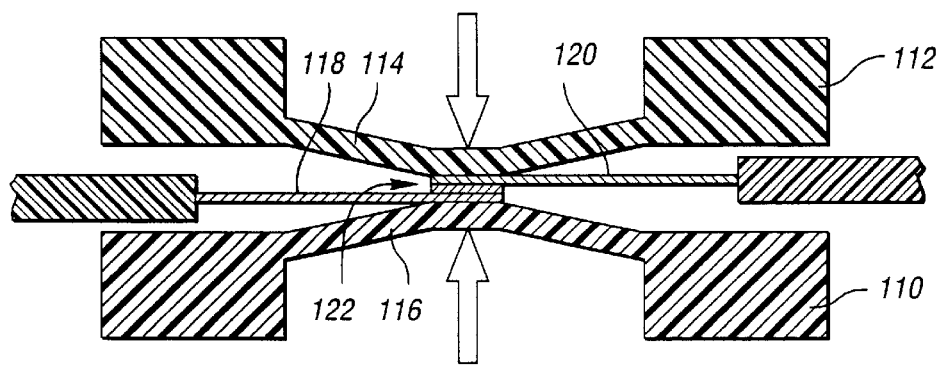

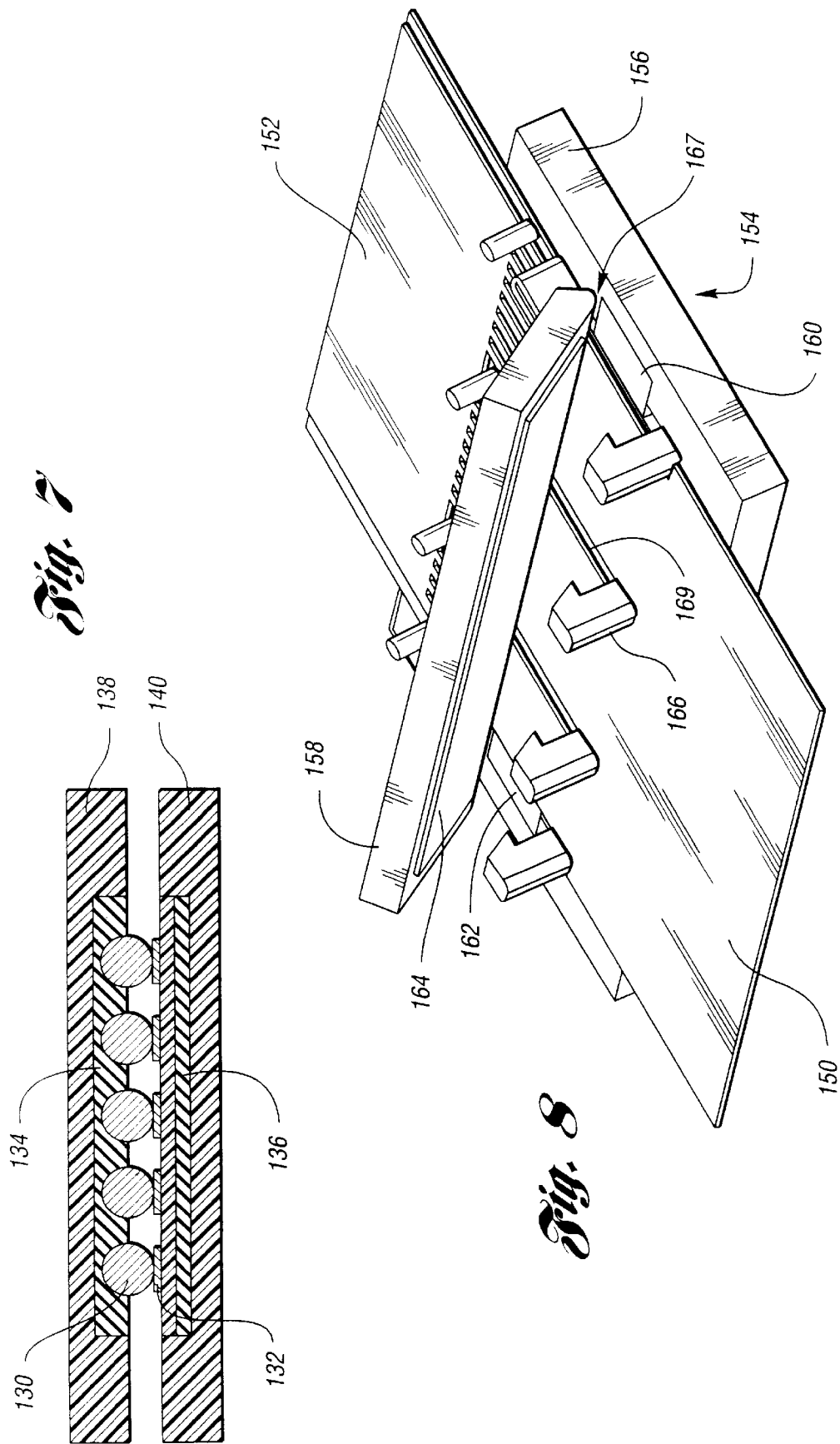

METHOD AND APPARATUS FOR PROVIDING PLANAR AND NON-PLANAR COMPLIANT ELECTRICAL CONNECTIONS BETWEEN ADJACENT CIRCUITS

TECHNICAL FIELD

The present invention relates to a method and apparatus for providing planar and non-planar compliant electrical connections, and more particularly to a method and apparatus for electrically interconnecting a circuit pattern with an adjacent circuit on a substrate wherein a compliant spring member is provided for creating a normal force at a single electrical interface between the circuit pattern and the adjacent circuit.

BACKGROUND OF THE INVENTION

Typically, electronic devices packaged beneath a vehicle instrument panel are mounted on a thin substrate (circuit board) enclosed within a plastic box or housing having wiring harnesses running into and out of the device. The box must be mounted to a support structure beneath the instrument panel and supported in an appropriate position, preferably behind the center stack bezel of the instrument panel for providing electronic support to the vehicle temperature control and sound systems, as well as other electronic instrument panel components, such as the antilock brake module, engine control module, air bag module, etc.

This assembly can consume a substantial amount of space beneath the instrument panel. The bulky metal box with bundles of wires extending therefrom has substantial space requirements, and adversely affects packaging design efficiency in the vehicle. Furthermore, the metal box increases manufacturing costs and vehicle weight.

Accordingly, it has been necessary to develop a method and apparatus for integrating assembly of structural and electronic components in a vehicle instrument panel in a manner in which packaging efficiency is improved, and manufacturing time, manufacturing cost, and weight are reduced.

U.S. patent application Ser. No. 08/642,723, now U.S. Pat. No. 5,712,764 assigned to the assignee of the present application, discloses a method of integrating assembly of structural and electronic components by installing circuit trace patterns directly onto structural components of the instrument panel. However, methods of interconnecting such circuits have yet to be developed. It is desirable to provide an interconnection method which incorporates the material of the supporting structure.

Known interconnection techniques have their advantages and disadvantages. For example, soldering will provide an excellent connection, however, it requires the heating of the interface region for attachment and removal of the circuit interconnection. To accomplish this task, the substrate material must be able to withstand elevated temperatures, typically above 183° C. As an alternative to soldering, the circuits may be interconnected using a pin and socket. This technique gives the designer the flexibility to place the interconnection at a desired location. However, using this method, the receptacle is typically soldered in place, and thus raises the same concerns as the direct soldering of the circuits.

In an alternative method, the receptacle may be installed using a compliant press-fit connection. When press-fit or compliant pin technology is used, it requires that the substrate maintain a force on the receptacle for a reliable assembly. Therefore, with a plastic substrate, the material selected must provide higher mechanical strength properties than that of a blow-molded polypropylene (PP), which would be a desirable material for an enclosure structure. The use of a pin to interconnect the electrical circuit will allow the removal of circuits from the substrate. Installation of a circuit with a pin will, however, require an insertion force of several pounds. Due to the compliance of the plastic substrate, the assembly area would have to be supported or buttressed.

Zero insertion force (ZIF) connectors are one possibility for eliminating the force problem referenced above. In zero insertion force connectors, a lever is used to pinch connection members together for electrical interconnection. Low insertion force connectors (LIF) are similar to ZIFs. Both LIFs and ZIFs are mechanically cammed, which requires surface space as well as a planar surface and the addition of a mechanical clamping lever. Such devices typically also include a plastic component which may creep, which results in loss of normal forces over time.

Accordingly, it is desirable to provide a method and apparatus for connecting adjacent circuits which allows for electrical interconnection along nonplanar substrate surfaces, creates an airtight seal to prevent oxygen entry, maintains a large normal force over time, and provides a wiping motion for wiping away contaminants and oxides to facilitate metal-to-metal contact.

DISCLOSURE OF THE INVENTION

The present invention overcomes the above-referenced shortcomings of prior art electrical interconnection devices by providing a method and apparatus for electrically interconnecting a circuit pattern with an adjacent circuit on a substrate by positioning the circuit pattern in direct physical contact with the adjacent circuit to create a single electrical interface, and using a compliant spring member supported by the substrate for providing a normal force at the single electrical interface, wherein the spring member is sufficiently flexible for electrical interconnection on non-planar substrates.

More specifically, the present invention provides a method of electrically interconnecting a circuit pattern with an adjacent circuit on a substrate, comprising: 1) positioning the circuit pattern in direct physical contact with the adjacent circuit to create a single electrical interface between the circuit pattern and the adjacent circuit; and 2) providing a compliant spring member supported by the substrate for creating a normal force at the single electrical interface for holding the circuit pattern and adjacent circuit together. The compliant spring member is sufficiently flexible to facilitate electrical interconnection of the circuits along a non-planar substrate.

The present invention further provides an apparatus for electrically interconnecting a circuit pattern with an adjacent circuit on a substrate. A substrate is provided for supporting an adjacent circuit in direct physical contact with a circuit pattern to create a single electrical interface between the circuit pattern and the adjacent circuit. The substrate is provided with a channel for receiving a compliant spring member. The compliant spring is configured to create a normal force at the single electrical interface for holding the circuit pattern and adjacent circuit together. The compliant spring member is sufficiently flexible to facilitate electrical interconnection of the circuits along a non-planar substrate.

In one embodiment, the channel is formed along an edge of the substrate, and the compliant spring member is an elongated elastomeric member disposed in the channel. In a further embodiment, a cover is provided with a tab protruding therefrom. An elastomeric member is connected to the tab, and the cover is installed onto the substrate such that the elastomeric member is inserted into the channel and the cover is positioned over the circuit pattern for protecting the circuit pattern.

In another embodiment, an elongated elastomeric member having electrical dielectric properties is hollow and includes a metallized interior surface as well as a plurality of discrete conductive regions on the outer surface of the hollow elastomeric member. In this configuration, the metallized interior surface and conductive regions cooperate to form a capacitor for filtering unwanted electrical signals.

In a further embodiment, the elastomeric member includes a top portion protruding from the channel. The top portion is metallized to form a compliant conductive button. In this configuration, a third mating circuit may be stacked over the substrate such that the third mating circuit is electrically interfaced with the compliant conductive button.

In a preferred embodiment, the flexible circuit pattern and adjacent circuit are laid in overlapping relationship in a channel formed in the substrate, and the compliant spring member is inserted into the channel over the overlapped flexible circuit pattern and adjacent circuit. The compliant spring member may be an elastomeric spring member or a non-elastomeric spring member, such as a compressed metal spring.

Alternatively, the compliant spring member may comprise a compressible spring member integrally molded as part of the substrate.

Accordingly, an object of the present invention is to provide a method and apparatus for electrically interconnecting a circuit pattern with an adjacent circuit on a substrate, wherein a single electrical interface is provided between the circuit pattern and the adjacent circuit, and electrical interconnection may be facilitated along a non-planar substrate surface.

The above object and other objects, features, and advantages of the present invention are readily apparent from the following detailed description of the best modes for carrying out the invention when taken in connection with the accompanying drawings.

BRIEF DESCRIPTION OF THE DRAWINGS

FIG. 4 shows a schematically arranged sectional view of an apparatus for electrically interconnecting a circuit pattern with an adjacent circuit, and further including a third mating circuit in accordance with a third alternative embodiment of the invention;

FIG. 5 shows a schematically arranged cross-sectional view of an apparatus for electrically interconnecting a flexible circuit pattern with an adjacent circuit in accordance with a fourth alternative embodiment of the invention;

FIG. 6 shows a schematically arranged sectional view of an apparatus for electrically interconnecting a flexible circuit pattern with an adjacent circuit in accordance with a fifth alternative embodiment of the invention;

FIG. 7 shows a schematically arranged sectional view of an apparatus for electrically interconnecting a circuit pattern with an adjacent circuit in accordance with a sixth alternative embodiment of the invention;

FIG. 8 shows a schematically arranged perspective view of an apparatus for electrically interconnecting a flexible circuit pattern with an adjacent circuit in accordance with a seventh alternative embodiment of the invention;

DETAILED DESCRIPTION OF THE PREFERRED EMBODIMENTS

The present invention presents an interconnection method which allows for the use of a metallized low temperature compliant substrate, such as those used in blow-molding processes. The metallization of the substrate will serve as an interconnection between the substrate and a partitioned circuit, or flexible circuit pattern. A "flexible circuit pattern" is a circuit pattern disposed within a thin flexible polymeric sheet, such that at least a portion of the "flexible circuit pattern" is flexible. The substrate metallization may be a conductive pattern which is plated onto the substrate, or it may comprise a flexible circuit inlay.

The invention also capitalizes upon the compliance of certain polymers, such as polypropylene (PP), to serve as a low insertion force receptacle for component mating. Further, the invention presents a removable retention elastomer which serves to retain an electrical interconnection between adjacent circuits, and to apply the required electrical interconnection normal force.

The invention was developed using polypropylene blow-molded base substrate, however the technique described herein could be used on a variety of materials over a wide range of material stiffnesses, as well as a variety of substrate manufacturing techniques.

The present invention provides a method and apparatus for establishing an electrical interconnection between two metallized surfaces, particularly between a circuit pattern and an adjacent circuit, by aligning their mating surfaces, and clamping the structure by means of a spring member supported by the substrate.

Figure 1:
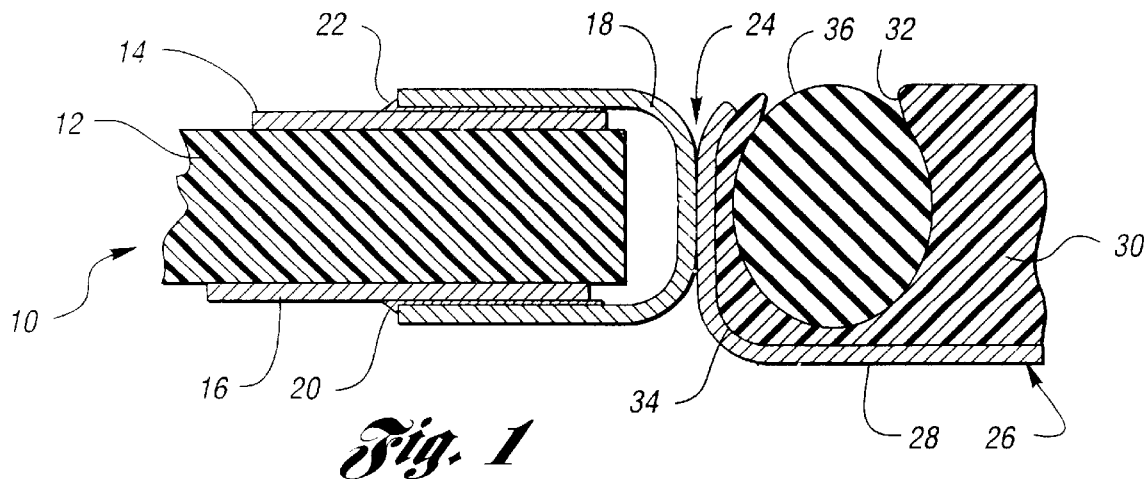
FIG. 1 shows a schematically arranged sectional view of an apparatus for electrically interconnecting a circuit pattern with an adjacent circuit on a substrate in accordance with the present invention.

Referring to FIG. 1, the present invention is illustrated schematically. The Figure schematically illustrates a method and apparatus for electrically interconnecting a rigid circuit pattern with an adjacent circuit. The circuit pattern 10 comprises a flexible circuit pattern substrate 12 with partitioned circuits represented by the conductive traces 14,16 on opposing sides of the circuit substrate 12. A metal edge clip 18, which is well known in the art, is soldered to the circuit traces 14,16 of the circuit pattern 10 at the solder locations 20,22. The metal edge clip 18 creates a conductive path from the circuit pattern 10 to the connection interface area 24. The connection interface area 24 provides a single electrical interface between the circuit pattern 10 and the adjacent circuit 26, which is represented by the circuit trace 28.

The adjacent circuit 26 is supported by a main substrate 30, which has a channel 32 formed therein along an edge 34 thereof. The main substrate 30 is preferably a molded plastic component. A spring member 36 is disposed within the channel 32. The spring member 36 is preferably an elongated elastomeric member, which acts as a spring for applying normal forces onto the connection interface area 24 to maintain the required mating interface forces. This interconnection method allows non-planar substrates to be interconnected due to the flexibility of the spring member 36. This type of elastomeric cord (spring member 36) is also easily replaceable, and removable for servicing of the partitioned substrate. Furthermore, in this configuration, the spring member 36 need not be electrically conductive, which enables the use of a variety of spring member materials, such as elastomers.

Figure 2:
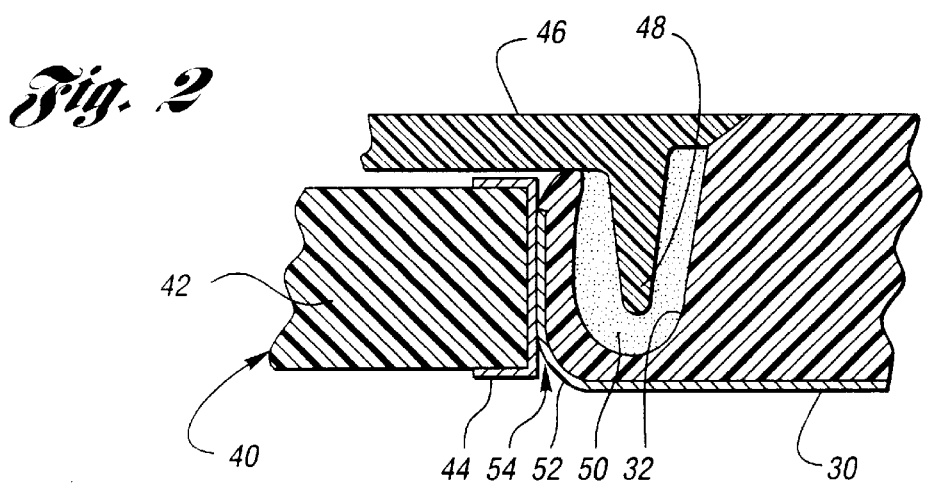
FIG. 2 shows a schematically arranged cross-sectional view of an apparatus for electrically interconnecting a circuit pattern with an adjacent circuit on a substrate in accordance with a first alternative embodiment of the invention.

Turning to FIG. 2, a first alternative embodiment of the invention is shown. Due to the compliancy of the elastomeric spring member 36, it is possible to eliminate the clip spring 18 shown in FIG. 1, and establish the connection interface directly to the base substrate. In this embodiment, the circuit pattern 40 comprises a substrate 42 with a circuit represented by a conductive trace 44 thereon. A plastic cover 46 is provided with a tab 48 protruding therefrom. The elastomeric member 50 is secured to the tab 48, and the cover is snapped onto the substrate 30, such that the elastomeric material 50 is disposed within the channel 32, and the cover 46 is disposed over the circuit pattern 40 for protecting the circuit pattern. The cover 46 may be configured to snap into the main substrate 30 to aid in assembly of the substrate and in installation of the elastomer 50. The elastomer 50 may or may not be integrally secured with the tab 48. The adjacent circuit supported by the main substrate 30 is illustrated by the circuit trace 52. Accordingly, in this configuration, the circuit traces 44,52 are electrically connected at a single interface 54.

Alternatively, the spring member or elastomeric member may comprise a thin-walled plastic tube which is compliant and, upon compression, provides force onto the surrounding walls. This plastic tubing may be extruded using a dielectric material, and later metallized on its inner and outer surfaces. Using this configuration, the tube will provide a capacitance between the terminal contact point and the inner wall of the tube. The configuration will then provide an electrical filter capacitor between the terminal and ground when the inner metallized tube wall is electronically grounded. The configuration could be further enhanced by coating the outer surface of the metallized tube with a resistive material, such as a polymer thick-film resistor material, so that the tube provides an interconnection node having a series resistor and capacitor with the metallization on the inside of the tube.

Figure 3:
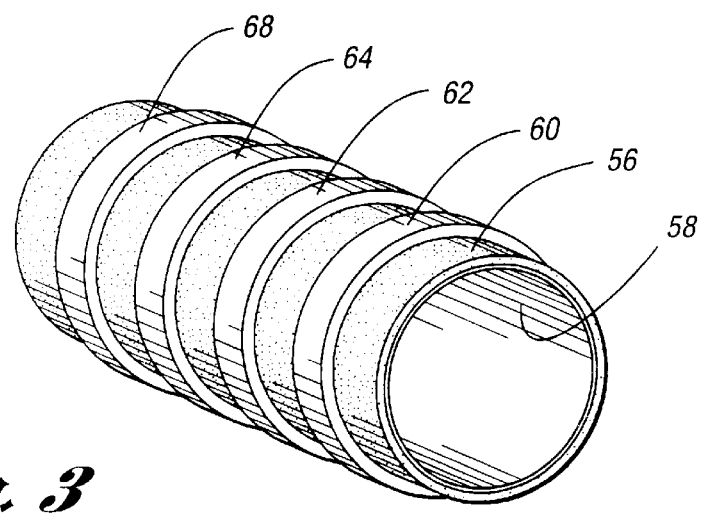
FIG. 3 shows a schematically arranged perspective view of an elastomeric member with conductive regions disposed thereon in accordance with a second alternative embodiment of the invention.

Such an alternative spring member embodiment is illustrated in FIG. 3. As shown, the hollow elastomeric tube 56 is provided with metallization 58 on its interior surface. Also, discrete conductive regions 60, 62, 64, 68 are provided on the outer surface of the elastomeric tube 56. Accordingly, when the assembly shown in FIG. 3 is inserted into the channel of the base substrate, the metallized surface 58 and the discrete conductive regions 60, 62, 64, 68 cooperate to form a capacitor for filtering unwanted electrical signals. The conductive regions 60, 62, 64, 68 may be established by a variety of techniques, such as direct application of a conductive material onto the elastomer. Conductive patterns may also be applied to the outside surface of the hollow (or solid) elastomeric tube 56, or assembled as a lamination, such as a flexible film circuit. The metallization 58 on the inner surface of the tube 56 forms a conductive path below all the contact points of the interconnection system, separated by the thickness of the tube wall. It is necessary to separate the metallization on the outside of the tube (i.e. the discrete conductive region 60, 62, 64, 68), and this separation may be accomplished by masking, abrasion cutting, laser trimming, or by using chemical etchants.

In still another configuration, the elastomer as described previously may be replaced with a circuit board having elastomeric properties within its base material or within a compliant assembly attached to it. In this case, the printed circuit board is compliantly clamped with the interface of the adjacent circuit. The elastomeric properties of the circuit board, or compliant assembly, serves as a spring to apply normal force onto the interconnection interface. Since the design incorporates a compliant interface, it provides a self-adjustable attribute to absorb variation in the assembly stack as well as built-in compensation to dimensional changes over environmental exposure. In addition, the compliant structure will also provide a damper to absorb mechanical vibrations. Alternatively, a pivotal attachment could be used for applying compressive forces to the spring member.

It is further possible to use the conductive elastomer for the interconnection of multiple substrates. This may be accomplished by allowing the elastomeric material to protrude out of the channel, where it may come in contact with a stacked substrate. Such a design is illustrated in FIG. 4.

Referring to FIG. 4, a third alternative embodiment of the invention is shown. In this embodiment, the main substrate 72 forms a channel 74 therein, and has a circuit trace 76 thereon which extends into the channel 74, and is representative of an adjacent circuit. A partitioned circuit 78 is representative of a circuit pattern, and includes a circuit trace 80 thereon representative of the circuit pattern supported by the partitioned circuit 78. The circuit trace 80 also extends into the channel 74. The elastomeric member 82 includes a metallized surface 84, and a top portion 86 which extends through the top of the channel 74, and is also metallized to form a compliant conductive button 88. Accordingly, a mating circuit 90 may be stacked on top of the main substrate 72 such that the conductive terminal 92 of the mating circuit 90 engages the metallization on the compliant conductive button 88. The elastomeric material 82, particularly the elastomeric features of the top portion 86 of the elastomeric material 82, will provide normal force for establishing the required interconnection forces between the conductive terminal 92 and the top of the conductive button 88.

Referring to FIG. 5, a fourth alternative embodiment of the invention is shown. This method provides a mating interface between two circuit elements by alignment of the two circuits and insertion into a C- or U-shaped channel. Once installed, an elastomeric spring is inserted into the channel to retain the circuit interface and to provide the required mating force. As shown, the substrate 96 is provided with a channel 98, and the flexible pattern 100 and adjacent circuit 102 are laid in overlapping relationship within the channel 98, and an elastomeric member 104 is then inserted into the channel 98 over the overlapped circuits for providing the required normal force for the electrical interface 106. This design is particularly advantageous for interconnecting flexible circuit patterns on a nonplanar substrate. The channel 98 may be easily formed in the substrate for facilitating such a method.

Turning to FIG. 6, an embodiment is provided in which the compliant spring member comprises a compression spring member which is molded as an integral part of the substrate. In the method shown, an elastomeric spring is formed above and below the mating electrical interface. The compression of these elastomer springs secures the mating position of the interface and provides the required normal mating force.

The embodiment shown in FIG. 6 provides a base substrate 110 and a cover 112, each of which form a spring member 114,116 as an integral part thereof. The spring members 114,116 cooperate to compress adjacent circuit patterns 118,120 together at the circuit interface 122 in the direction indicated by the arrows.

In the embodiment shown in FIG. 7, a plurality of wires 130 are electrically connected to a circuit pattern 132 by compressing the wires 130 against the circuit pattern 132 by means of opposing elastomeric spring members 134,136, which are supported, respectively, by a cover 138 and base substrate 140.

A seventh alternative embodiment of the invention is illustrated in FIG. 8. In this embodiment, first and second flexible circuit patterns 150,152 are electrically interconnected by means of a clamping device 154. The clamping device 154 comprises a base 156 with a cover 158 hinged thereto. The base 156 and cover 158 are provided with elastomeric pads 160, 162, 164 for compressing the circuit patterns 150,152 together. For attachment, the first flexible circuit pattern 152 is installed over the base 156 and properly aligned by the clamps 166. The second flexible circuit pattern 150 is then inserted underneath the cover 158 in a manner to overlay the first flexible circuit pattern 152. The cover 158 is then pivoted toward the base 156 about the hinge 167, and the pad 164 grabs the flexible circuit pattern 150 and partially slides it across the circuit pattern 152 to create a wiping action for wiping contaminants from the interconnection area. The slots 169 allow this sliding of the pattern 150 along the clamps 166. The clamps 166 then engage the cover 158 for locking the interconnection. In this configuration, the elastomeric pads 160, 162, 164 provide the required normal force for electrically interconnecting the first and second flexible circuit patterns 150,152. Preferably, a living hinge arrangement is used for hinging the cover 158 to the base 156.

The elastomeric pads 160, 162, 164 serve as the compliant spring to maintain the required clamping and mating force on the electrical interface. The elastomeric pads, when incorporated with the cover 158, may provide for environmental sealing and electrical insulation of the connection. It should be noted that in this configuration, the elastomeric springs may be replaced by designing a spring member into the base or cover structure, as shown in FIG. 6.

The two mating circuit substrates 150,152 may be separate elements, part of the base or cover structure, or a wiring harness. For example, the electrical connection can be flex-circuit-to-flex-circuit, FR4-to-flex-circuit, flex-circuit-to-encapsulated-wiring, or other variations. Additionally, one or both of the substrates may be populated with electronic components adjacent the electrical interconnection.

Figure 9:
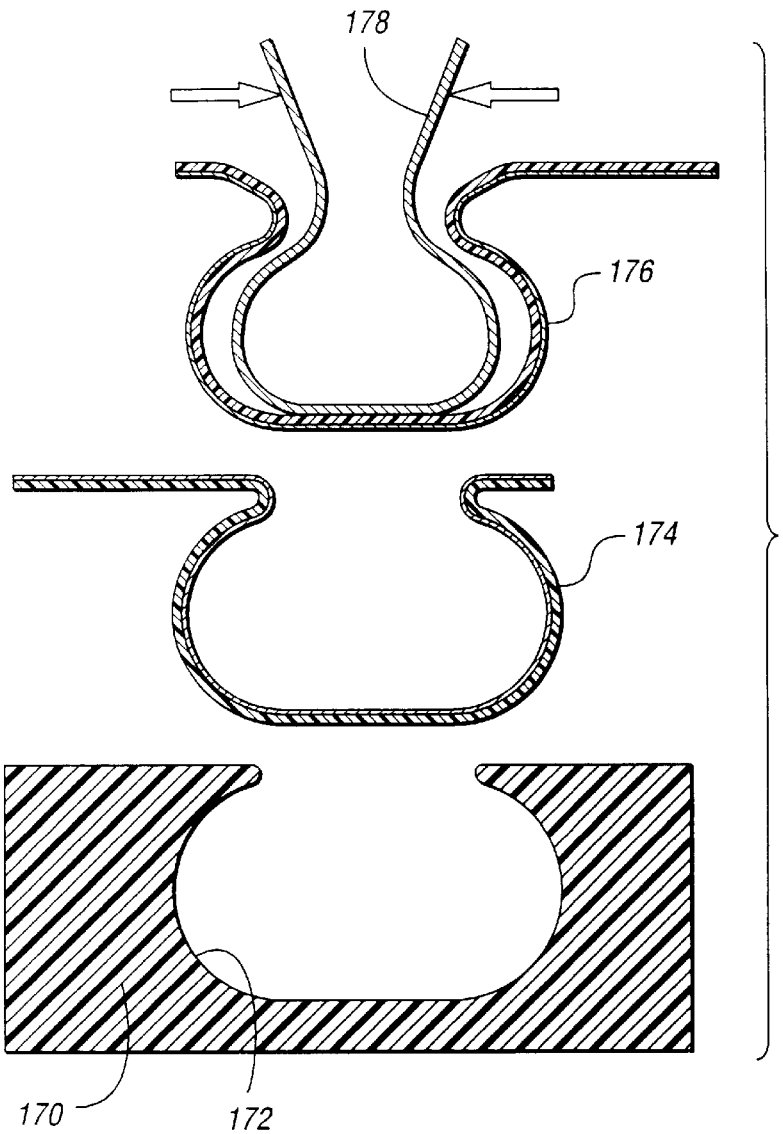
FIG. 9 shows a schematically arranged exploded sectional view of an apparatus for electrically interconnecting a flexible circuit pattern with an adjacent circuit in accordance with an eighth alternative embodiment of the invention.
Figure 10:
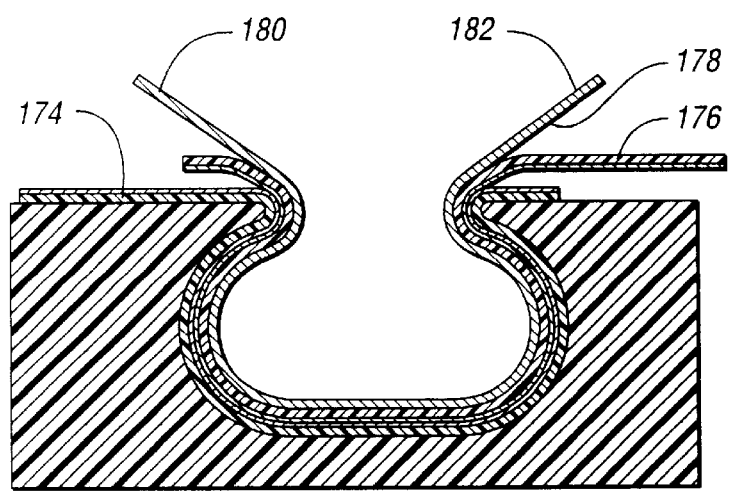
FIG. 10 shows a schematically arranged sectional view of the assembly illustrated in FIG. 9.

Turning to FIGS. 9 and 10, an eighth alternative embodiment of the invention is shown schematically in which the elastomeric spring described with reference to the previous embodiments is replaced by a formed metal spring. As shown, the substrate 170 includes a channel 172 formed therein, and first and second flexible circuit patterns 174,176 are overlaid within the channel 172, and a compressed spring 178 is inserted into the channel 172 over the overlaid flexible circuits 174,176 for providing the required normal force for the electrical connection between the circuits 174,176.

In this configuration, as in other configurations described herein, wiping away of contaminants and oxides is accomplished when the compressed spring is inserted into the channel, thus allowing metal-to-metal contact between the adjacent substrates 174,176. It is possible that the distal ends 180,182 of the spring 178 could be used as a heat sink for dissipating heat generated at the electrical interconnection between the substrates 174,176, if needed. Also, the spring 178 could be used as an electrical contact or it could be bent to facilitate stacking of a mating circuit board on top of the assembly.

While the best modes for carrying out the invention has been described in detail, those familiar with the art to which this invention relates will recognize various alternative designs and embodiments for practicing the invention within the scope of the appended claims.

What is claimed is:

1. A method of electrically interconnecting a circuit pattern with an adjacent circuit on a substrate having a channel formed therein, comprising:

positioning the circuit pattern in direct physical contact with the adjacent circuit by laying the circuit pattern and adjacent circuit in overlapping relationship in the channel to create a single electrical interface between the circuit pattern and the adjacent circuit; and inserting a compliant spring member into the channel over the overlapped circuit pattern and adjacent circuit for creating a normal force at said single electrical interface for holding the circuit pattern and adjacent circuit together, wherein said compliant spring member is sufficiently flexible to facilitate electrical interconnection of said circuits along a non-planar substrate.

2. The method of claim 1, wherein said step of providing a compliant spring member supported by the substrate comprises:

forming a channel along an edge of the substrate; and inserting an elongated elastomeric member in the channel to form the spring member.

3. An apparatus for electrically interconnecting a circuit pattern with an adjacent circuit, comprising:

a substrate supporting the adjacent circuit and having a channel formed in the substrate such that the circuit pattern and adjacent circuit are overlayed and directly contact each other within the channel to form a single electrical interface; and a compliant spring member supported within the channel of the substrate and configured to create a normal force at said single electrical interface for maintaining said direct contact, wherein said compliant spring member is sufficiently flexible to facilitate electrical interconnection of said circuits along a non-planar substrate.

4. The apparatus of claim 3, wherein said substrate forms a channel along an edge thereof, and said compliant spring member comprises an elongated elastomeric member disposed in the channel.

* * * * *